(12) United States Patent
Nohara

(10) Patent No.: US 8,217,733 B2
(45) Date of Patent: Jul. 10, 2012

(54) INFORMATION PROCESSING APPARATUS AND METHOD OF MANUFACTURING THE SAME

(75) Inventor: Kouichi Nohara, Oume (JP)

(73) Assignee: Fujitsu Toshiba Mobile Communications Limited, Kawasaki (JP)

( * ) Notice: Subject to any disclaimer, the term of this patent is extended or adjusted under 35 U.S.C. 154(b) by 308 days.

(21) Appl. No.: 12/640,329

(22) Filed: Dec. 17, 2009

(65) Prior Publication Data
US 2010/0156574 A1 Jun. 24, 2010

(30) Foreign Application Priority Data
Dec. 18, 2008 (JP) ................ P2008-322011

(51) Int. Cl.
*H03H 2/00* (2006.01)
*H04B 5/00* (2006.01)

(52) U.S. Cl. ..................... 333/24 R; 455/41.1

(58) Field of Classification Search ............... 333/24 R; 455/41.1, 41.2, 120, 121; 343/745
See application file for complete search history.

(56) References Cited

U.S. PATENT DOCUMENTS
8,041,295 B2 * 10/2011 Simada ............... 455/41.1
2011/0205133 A1 * 8/2011 Fukasawa ............. 343/745

FOREIGN PATENT DOCUMENTS
JP 2007-306240 A 11/2007

* cited by examiner

*Primary Examiner* — Dean O Takaoka
(74) *Attorney, Agent, or Firm* — Maschoff Gilmore & Israelsen

(57) ABSTRACT

An information processing apparatus having a non-contact IC portion which performs radio communication with a reader/writer is provided. The non-contact IC portion includes: capacitors connected so that capacitance can be changed between multiple stages; a coil connected to the capacitors; and a switching portion which turns on/off connection of the capacitors so that a resonance frequency expressed based on capacitance of the capacitors and inductance of the coil is set within a given effective resonance frequency range.

8 Claims, 9 Drawing Sheets

INFORMATION PROCESSING APPARATUS AND METHOD OF MANUFACTURING THE SAME

CROSS-REFERENCE TO RELATED APPLICATIONS

This application is based on Japanese Patent Application (Japanese Patent Application 2008-322011) filed on Dec. 18, 2008 and contents thereof are incorporated herein as a reference.

BACKGROUND

1. Field of the Invention

The present invention relates to an information processing apparatus and a method of manufacturing the same, and particularly relates to an information processing apparatus using a non-contact IC chip for exchanging information by radio communication and a method of manufacturing the same.

2. Description of Related Art

Not only a communication function simply based on telephone call but also various functions such as an address book function, a mail function through a network such as the Internet, a browser function capable of browsing a Web page and the like have been mounted in a cellular phone in recent years. On the other hand, a non-contact IC chip (such as FeliCa chip®)) has been built in a given position of a cellular phone so that electronic money service, various kinds of authentication functions, etc. using the non-contact IC chip are provided to the cellular phone. Especially, service for purchasing a ticket in use of a railway and checking the ticket in passage through a ticket gate has been performed by use of the non-contact IC chip.

When the non-contact IC chip built in the cellular phone is used for purchasing a ticket, purchasing a commodity, and so on, information is exchanged between the non-contact IC chip and an IC reader/writer installed in a ticket gate of a station or each terminal. Specifically, when the cellular phone having the built-in non-contact IC chip is brought near to an IC reader/writer so that the cellular phone receives electromagnetic waves radiated from the IC reader/writer, the non-contact IC chip performs radio communication with the IC reader/writer by using various kinds of information according to the received electromagnetic waves.

There are various IC readers/writers which perform radio communication with the non-contact IC chip. An optimum resonance frequency used when the non-contact IC chip performs radio communication with an IC reader/writer varies depending on the IC reader/writer which is a partner of radio communication. Therefore, a width of an effective resonance frequency band of the non-contact IC chip is set to be a band width expressed by ANDing widths of the optimum resonance frequency band of IC readers/writers with which the non-contact IC chip performs radio communication.

Incidentally, as a technique related to a non-contact IC chip, JP-A-2007-306240 discloses an integrated circuit including: a first capacitor and a second capacitor connected so that capacitance can be changed between multiple stages; an antenna coil connected to the first capacitor and the second capacitor so that inductance can be changed between multiple stages; a resistor connected to the first capacitor, the second capacitor and the antenna coil so that electric power is consumed; and a switching portion which switches capacitance of the first capacitor and the second capacitor and inductance of the antenna coil to set a resonance frequency within a given range in response to a magnetic field from a reader/writer.

The number of kinds of IC readers/writers with which the non-contact IC chip performs radio communication tends to increase. The width of the effective resonance frequency band of the non-contact IC chip decreases as the number of kinds of IC readers/writers increases. For this reason, great strictness is required for determining constants at the time of determining the effective resonance frequency of the non-contact IC chip. However, even if constants for determining the effective resonance frequency of the non-contact IC chip were determined strictly, the resonance frequency of the non-contact IC chip may be consequently out of a desired effective resonance frequency band because of variations at the time of manufacturing the cellular phone. If the cellular phone in which the resonance frequency of the non-contact IC chip is out of the desired effective resonance frequency band is produced frequently, a yield at the time of manufacturing the cellular phone is lowered.

SUMMARY

According to a first aspect of the invention, the information processing apparatus is provided with a non-contact IC portion which performs radio communication with a reader/writer, and the non-contact IC portion includes: capacitors connected so that capacitance can be changed between multiple stages; a coil connected to the capacitors; and a switching portion which turns on/off connection of the capacitors so that a resonance frequency expressed based on capacitance of the capacitors and inductance of the coil is set within a range of a given effective resonance frequency.

Other features and effects will be obvious from the description of embodiments and appending claims.

BRIEF DESCRIPTION OF THE DRAWINGS

FIGS. 8A and 8B are diagrams showing influence on waveform characteristic based on difference in configuration of SW set to be ON; and FIGS. 9A to 9C are graphs showing distortion of waveform characteristic based on difference in configuration of SW set to be ON.

DETAILED DESCRIPTION

Figure 1A:
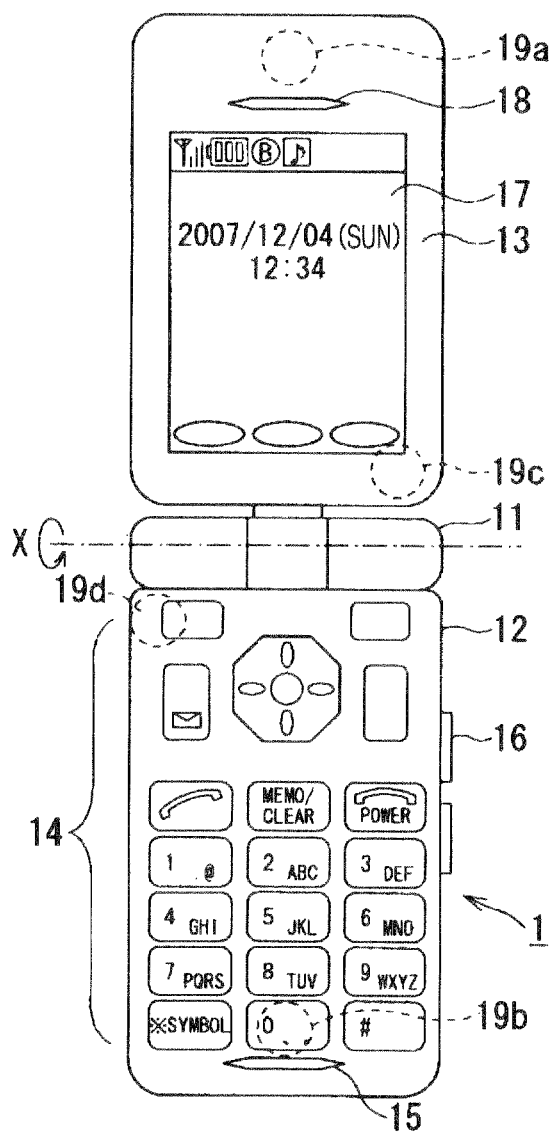
FIGS. 1A and 1B are views showing an external configuration of a cellular phone which can be used as an information processing apparatus according to the present invention.
Figure 1B:
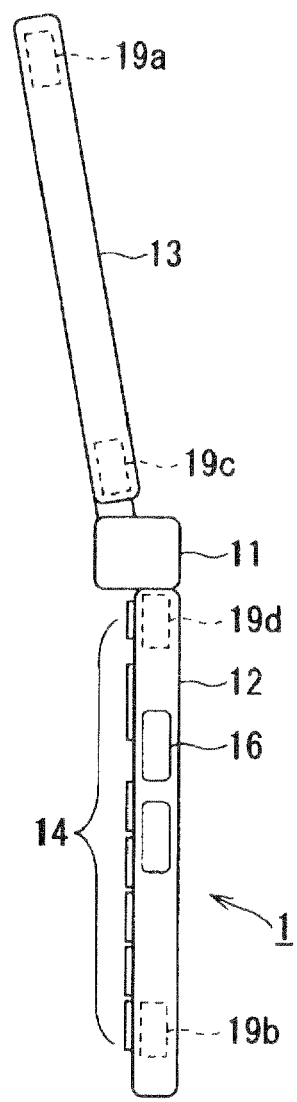

An embodiment of the invention will be described below with reference to the drawings. FIGS. 1A and 1B show an external configuration of a cellular phone 1 which can be used as an information processing apparatus according to the present invention. Incidentally, FIG. 1A shows the external configuration of the cellular phone 1 viewed from the front when the cellular phone 1 is unfolded at about 180 degrees, and FIG. 1B shows the external configuration of the cellular phone 1 viewed from a side when the cellular phone 1 is unfolded.

As shown in FIGS. 1A and 1B, in the cellular phone 1, a hinge portion 11 provided in a center of the cellular phone 1 is provided as a boundary between a first housing 12 and a second housing 13 to hinge-connect the first housing 12 and the second housing 13 to each other so that the cellular phone 1 is formed so as to be foldable in a direction of an arrow X through the hinge portion 11. A transmission/reception antenna (antenna 31 in FIG. 3 which will be described later) is provided in a given position of an inside of the cellular phone 1, so that the cellular phone 1 receives/transmits electric waves from/to a base station (not shown) through the built-in antenna 31.

Operation keys 14 such as numeral keys "0" to "9", a call key, a redial key, an end/power key, a clear key and an e-mail key are provided in a surface of the first housing 12, so that a user can input various kinds of instructions by using the operation keys 14.

Cross keys and a decide key are provided as the operation keys 14 in an upper portion of the first housing 12. The user can move a picked cursor up, down, left and right by operating the cross keys in up, down, left and right directions. Specifically, various operations such as a scrolling operation of a phone directory list or an e-mail displayed on a main display 17 provided in the second housing 13, a paging operation of a simple homepage and an image feeding operation are executed by the operation of the cross keys.

The user can decide various functions by pushing the decide key. When, for example, a desired phone number is selected from phone numbers in the phone directory list displayed on the main display 17 in accordance with a user's operation of the cross keys in the first housing 12 and the decide key is pushed inward of the first housing 12, the selected phone number is decided and a calling process is performed for the phone number.

An e-mail key is provided in an immediate left of the cross keys and the decide key in the first housing 12. When the e-mail key is pushed inward of the first housing 12, a mail sending/receiving function is called. A browser key is provided in an immediate right of the cross keys and the decide key. When the browser key is pushed inward of the first housing 12, data of a Web page can be browsed.

A microphone 15 is provided in a lower portion of the first housing 12 than the operation keys 14, so that the microphone 15 collects user's voice while on the cellular phone. Side keys 16 for operating the cellular phone 1 are further provided in the first housing 12.

A battery pack not shown is attached to a rear side of the first housing 12. When the end/power key is turned on, electric power from the battery pack is supplied to respective circuit portions so that the cellular phone 1 starts up to an operable state.

On the other hand, the main display 17 is provided in a front surface of the second housing 13. The main display 17 displays a state of reception of electric waves, residual battery capacity, names and phone numbers registered in a phone directory, sending history, contents of e-mails, simple homepage, images picked up by a Charged Coupled Device (CCD) camera (CCD camera 20 in FIG. 2A which will be described later), contents received from an external contents server (not shown) and contents stored in a memory card (memory card 46 in FIG. 3 which will be described later). A receiver 18 is further provided in a given position of an upper portion of the main display 17, so that the user can talk by voice by using the receiver 18. A speaker (speaker 50 in FIG. 3) which is another audio output portion than the receiver 18 is further provided in a given position of the cellular phone 1.

Magnetic sensors 19a, 19b, 19c and 19d for detecting a state of cellular phone 1 are provided in given internal positions of the first housing 12 and the second housing 13. Incidentally, for example, the main display 17 may be a display composed of organic EL or a liquid crystal display.

Figure 2A:
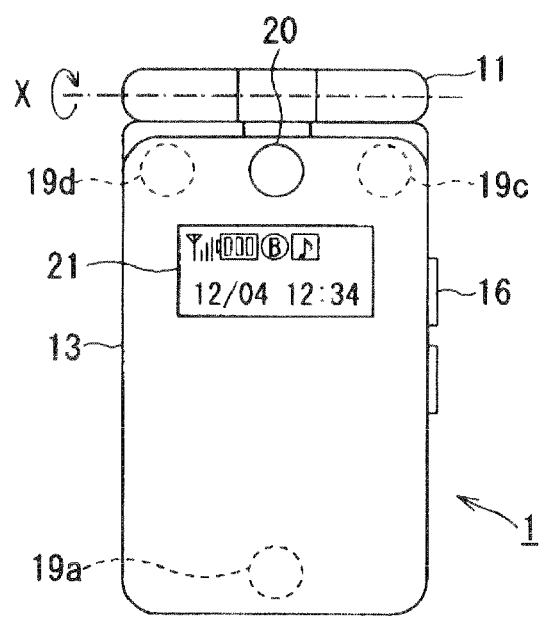
FIGS. 2A and 2B are views showing another external configuration of the cellular phone which can be used as the information processing apparatus according to the present invention.
Figure 2B:
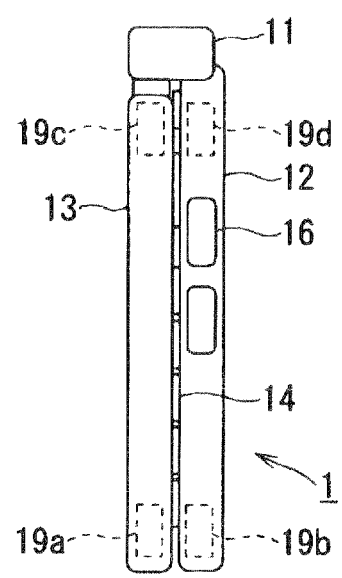

FIGS. 2A and 2B show another external configuration of the cellular phone 1 which can be used as the information processing apparatus according to the present invention. The state of the cellular phone 1 in FIGS. 2A and 2B is a state in which the cellular phone 1 is rotated in a direction of an arrow X in FIG. 2A from the state in FIGS. 1A and 1B. Incidentally, FIG. 2A shows the external configuration of the cellular phone 1 viewed from the front when the cellular phone 1 is folded, and FIG. 2B shows the external configuration of the cellular phone 1 viewed from a side when the cellular phone 1 is folded.

The CCD camera 20 is provided in an upper portion of the second housing 13, so that an image of a desired subject to be photographed can be captured by the CCD camera 20. A sub display 21 is provided in a lower portion of the CCD camera 20, so that the sub display 21 displays an antenna pictogram indicating a current sensitivity level of the antenna, a battery pictogram indicating a current battery capacity of the cellular phone 1, the current time, etc.

Figure 3:
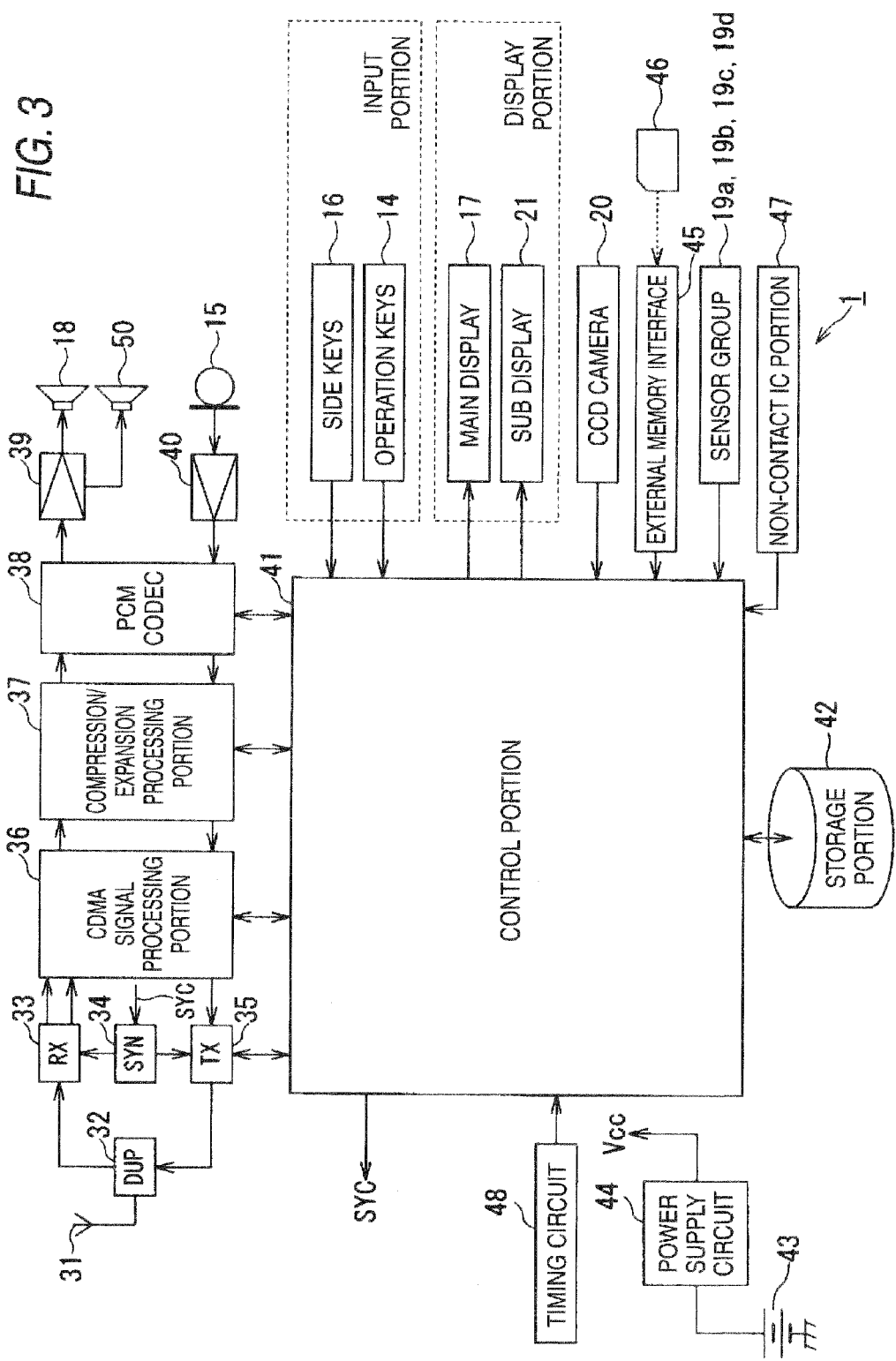
FIG. 3 is a block diagram showing an internal configuration of the cellular phone which can be used as the information processing apparatus according to the present invention.

FIG. 3 shows an internal configuration of the cellular phone 1 which can be used as the information processing apparatus according to the present invention. A radio signal transmitted from a base station not shown is received by the antenna 31 and then input to a reception circuit (RX) 33 through an antenna duplicator (DUP) 32. The reception circuit 33 down-converts the received radio signal into an intermediate frequency signal by mixing the received radio signal with a local oscillation signal output from a frequency synthesizer (SYN) 34. The reception circuit 33 further outputs a reception baseband signal by quadrature demodulation of the down-converted intermediate frequency signal. Incidentally, the frequency of the local oscillation signal generated from the frequency synthesizer 34 is designated by a control signal SYC output from a control portion 41.

The reception baseband signal from the reception circuit 33 is input to a CDMA signal processing portion 36. The CDMA signal processing portion 36 has a RAKE receiver not shown. This RAKE receiver performs an inverse diffusion process of a plurality of paths contained in the reception baseband signal with respective diffusion codes (i.e. the same diffusion code as a diffusion code of the diffused reception signal). The signal of each of the inverse diffused paths is subjected to phase adjustment, and then subjected to coherent Rake synthesizing. Rake synthesized data series are subjected to de-interleaving and channel decoding (error correction decoding) and then subjected to binary data determination. As a result, reception packet data with a predetermined transmission format are obtained. The reception packet data are input to a compression/expansion processing portion 37.

The compression/expansion processing portion 37 is formed of a digital signal processor (DSP), etc. The compression/expansion processing portion 37 demultiplexes the reception packet data output from the CDMA signal processing portion 36 in accordance with respective media by a not-shown demultiplexing portion and performs a decoding process on the data demultiplexed in accordance with the media. For example, in a telephone call mode, audio data corresponding to speech voice or the like contained in the reception packet data are decoded with a speech codec. For example, in a television telephone mode etc. in which video data are contained in the reception packet data, the video data are decoded with a video codec. Further, when the reception packet data are downloaded contents, the compression/expansion processing portion 37 expands the downloaded contents and then outputs the expanded downloaded contents to the control portion 41.

A digital audio signal obtained by the decoding process is fed to a PCM codec 38. The PCM codec 38 PCM-decodes the digital audio signal output from the compression/expansion processing portion 37 and outputs a PCM-decoded analog audio signal to a reception amplifier 39. This analog audio signal is amplified by the reception amplifier 39 and then output from the receiver 18.

The digital video signal decoded with the video codec by the compression/expansion processing portion 37 is input to the control portion 41. The control portion 41 displays videos based on the digital video signal output from the compression/expansion processing portion 37, on the main display 17 through a video RAM (e.g. VRAM, etc.) not shown. Incidentally, the control portion 41 can display not only the received video data but also video data captured by the CCD camera 20, on the main display 17 through the video RAM not shown.

When the reception packet data are an e-mail, the compression/expansion processing portion 37 feeds the e-mail to the control portion 41. The control portion 41 stores the e-mail fed from the compression/expansion processing portion 37 in a storage portion 42. The control portion 41 reads this e-mail stored in the storage portion 42 to display the read e-mail on the main display 17 in accordance with a user's operation of the operation keys 14 as an input portion.

On the other hand, in a telephone call mode, a speaker's (user's) voice signal (analog audio signal) input to the microphone 15 is amplified to an optimum level by a transmission amplifier 40 and then PCM-coded with a PCM codec 38. This PCM-coded digital audio signal is input to the compression/expansion processing portion 37. A video signal output from the CCD camera 20 is digitalized by the control portion 41 and input to the compression/expansion processing portion 37. An e-mail which is text data created by the control portion 41 is input to the compression/expansion processing portion 37.

The compression/expansion processing portion 37 performs compression coding of the digital audio signal output from the PCM codec 38 with a format in accordance with a predetermined transmission data rate. As a result, audio data are generated. The compression/expansion processing portion 37 performs compression coding of the digital video signal output from the control portion 41 to thereby generate video data. The compression/expansion processing portion 37 multiplexes and packetizes these audio data and video data in accordance with a predetermined transmission format by the not-shown demultiplexing portion. Then, the compression/expansion processing portion 37 outputs the packetized transmission packet data to the CDMA signal processing portion 36. Incidentally, when an e-mail is output from the control portion 41, the compression/expansion processing portion 37 multiplexes the e-mail to transmission packet data.

The CDMA signal processing portion 36 applies a spectrum diffusion process to the transmission packet data output from the compression/expansion processing portion 37 by using a diffusion code allocated to a transmission channel, and outputs the spectrum diffused output signal to a transmission circuit (TX) 35. The transmission circuit 35 modulates the spectrum diffused signal by using a digital modulation system such as a quadrature phase shift keying (QPSK) system. The transmission circuit 35 up-converts the digital modulated transmission signal into a radio signal by mixing the transmission signal with a local oscillation signal generated by the frequency synthesizer 34. The transmission circuit 35 high-frequency amplifies the radio signal generated by this up-conversion to a transmission power level designated by the control portion 41. The high-frequency amplified radio signal is fed to the antenna 31 through the antenna duplicator 32 and then transmitted from the antenna 31 toward a base station not shown.

The cellular phone 1 further has an external memory interface 45. The external memory interface 45 has a slot provided so that a memory card 46 can be attached/detached to/from the slot. The memory card 46 is a kind of flash memory card represented by a NAND flash memory card, a NOR flash memory card, or the like. Various kinds of data such as image data, voice data, sound data, etc. can be written/read in/from the memory card 46 through a 10-pin terminal. The cellular phone 1 further has a timing circuit (timer) 48 which measures the current accurate time.

The control portion 41 has a central processing unit (CPU), a read only memory (ROM), a random access memory (RAM), etc. The CPU controls the cellular phone 1 generally by executing various kinds of processes in accordance with programs stored in the ROM or various kinds of application programs inclusive of an operating system (OS) loaded from the storage portion 42 to the RAM, generating various control signals and feeding the control signals to respective parts. The RAM suitably stores data, etc, necessary for the CPU to execute various kinds of processes.

For example, the storage portion 42 is made of a flash memory device which is an electrically rewritable and erasable nonvolatile memory, a hard disc drive (HDD), etc. The storage portion 42 stores various application programs executed by the CPU of the control portion 41 and various data groups. A power supply circuit 44 generates a predetermined operating power supply voltage Vcc based on an output of a battery 43 and supplies the power supply voltage Vcc to respective circuit portions. The battery 43 includes a not-shown protecting circuit to form a battery pack. When the cellular phone 1 is brought near to an IC reader/writer (not shown) to receive electromagnetic waves radiated from the IC reader/writer (not shown), a non-contact IC portion 47 accordingly performs radio communication with the IC reader/writer by using various kinds of information.

Figure 4:
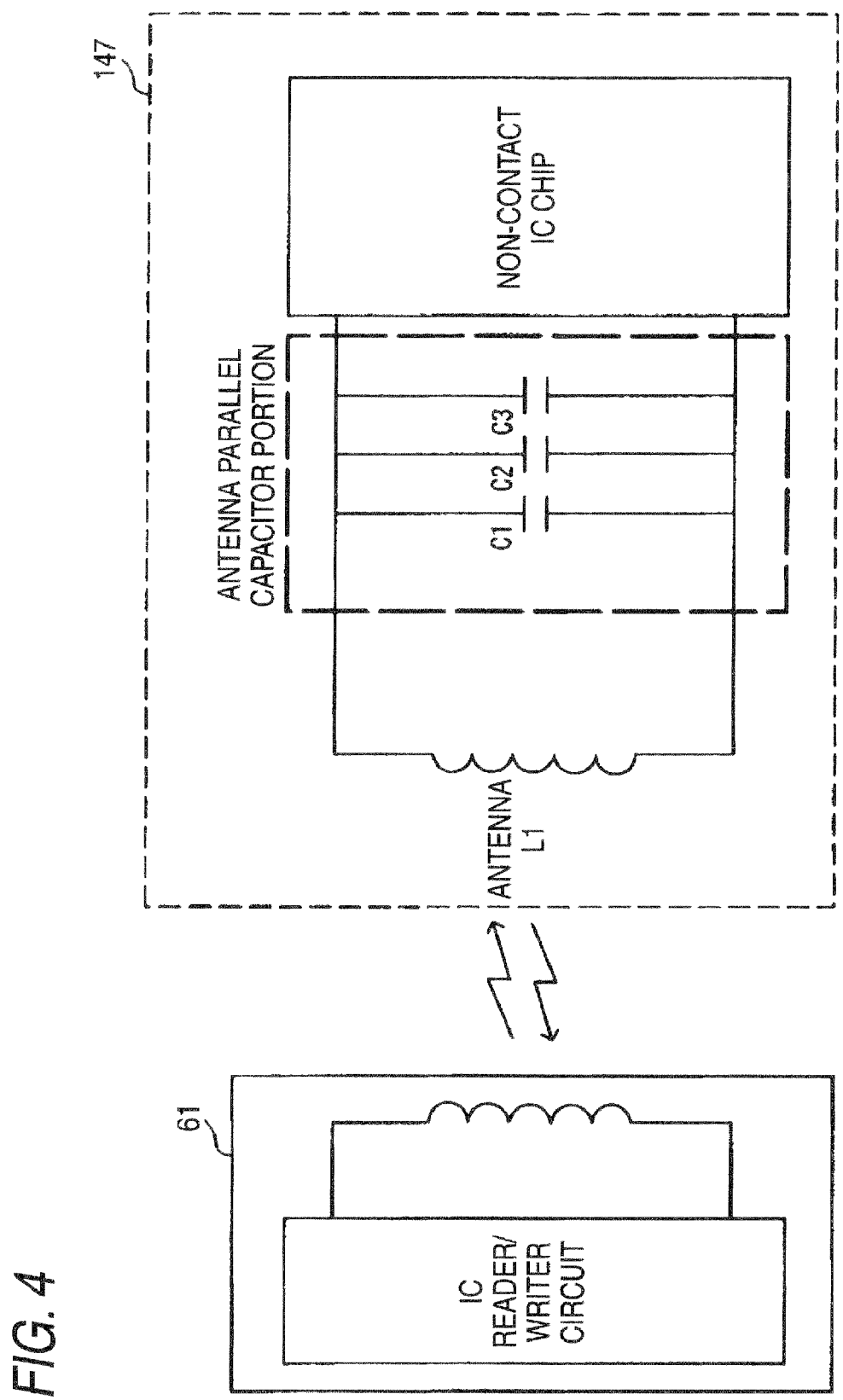
FIG. 4 is a view showing a measuring method of a resonance frequency in a conventional non-contact IC portion after assembling of the cellular phone.

The number of types of IC readers/writers which perform radio communication with the non-contact IC portion 47 tends to increase. A width of an effective resonance frequency band of the non-contact IC portion 47 decreases as the number of types of IC readers/writers increases. For this reason, great strictness is required for determining constants at the time of determining the effective resonance frequency of the non-contact IC portion 47. FIG. 4 shows a method of measuring a resonance frequency of a conventional non-contact IC portion 147 after assembling of the cellular phone 1. As shown in FIG. 4, the conventional non-contact IC portion 147 has a non-contact IC chip, an antenna parallel capacitor portion having parallel capacitors C1 to C3, and an antenna L1. A capacitance value of the antenna parallel capacitor portion is a fixed value. After the non-contact IC portion 147 is incorporated in the cellular phone 1, an IC reader/writer 61 performs radio communication with the non-contact IC portion 147 to thereby measure the resonance frequency $f_0$ of the non-contact IC portion 147. Incidentally, the resonance frequency $f_0$ of the non-contact IC portion 147 is expressed by $1/\{2\pi\sqrt{L1\times(C1+C2+C3)}\}$. However, even if constants for determining, the effective resonance frequency of the conventional non-contact IC portion 147 were determined strictly, the resonance frequency of the non-contact IC portion 147 may be consequently out of a desired effective resonance frequency band because of variations at the time of manufacturing the cellular phone 1. If the cellular phone 1 in which the resonance frequency of the non-contact IC portion 147 is out of the desired effective resonance frequency band is produced frequently, a yield at the time of manufacturing the cellular phone 1 is lowered.

Figure 5:
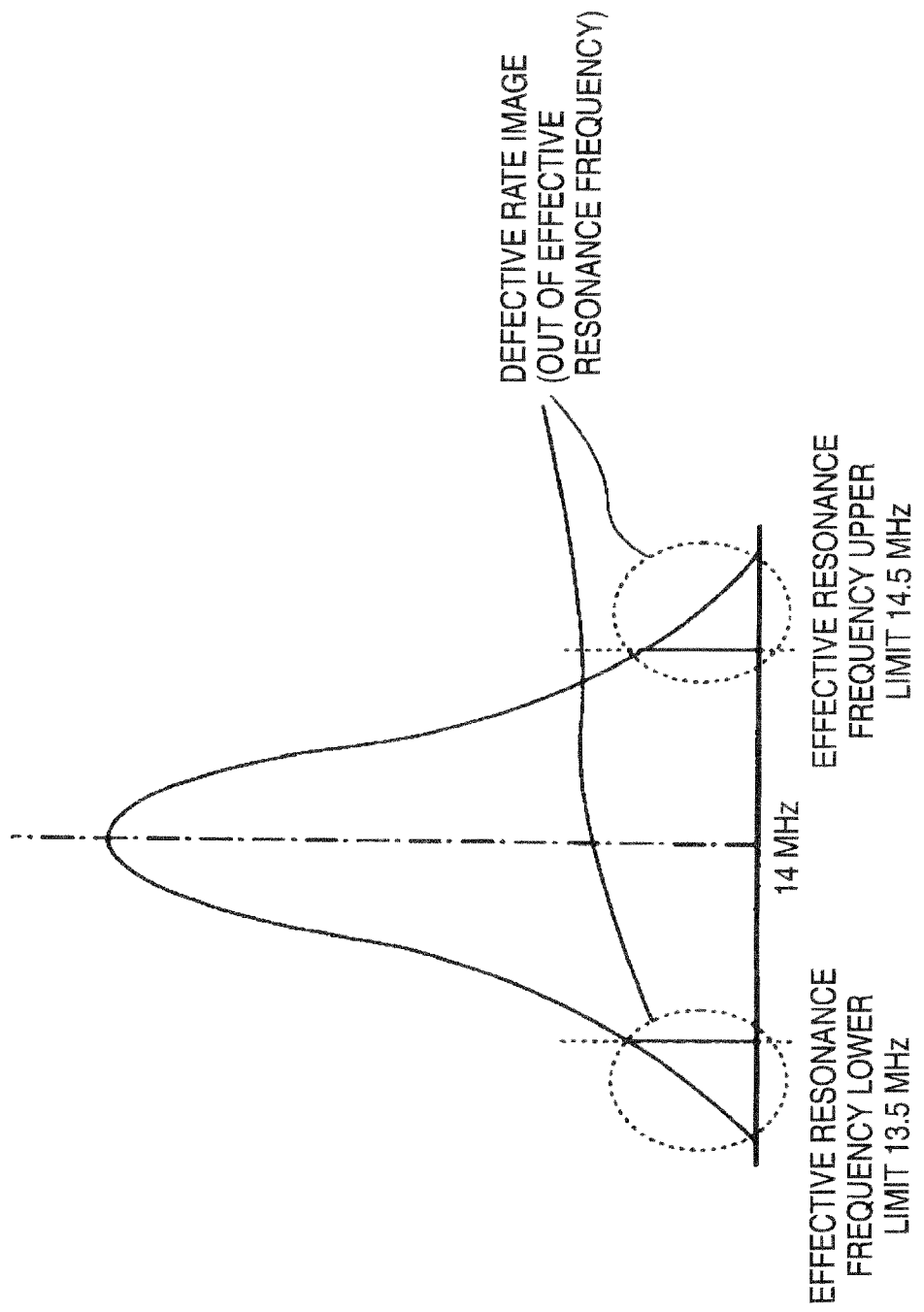
FIG. 5 is a graph showing a state in which the resonance frequency of the non-contact IC portion is out of a desired effective resonance frequency band because of variations at the time of manufacturing the cellular phone.

FIG. 5 shows a state in which the resonance frequency of the non-contact IC portion 147 is out of the desired effective resonance frequency band because of variations at the time of manufacturing the cellular phone 1. For example, assume that a center frequency of the effective resonance frequency with respect to the non-contact IC portion 147 is 14 MHz, and lower and upper limits of the effective resonance frequency are 13.5 MHz and 14.5 MHz respectively. A width of the effective resonance frequency band on this occasion is 1 MHz. However, if the resonance frequency of the non-contact IC portion 147 is, for example, 13.2 MHz, 14.8 MHz, or the like, consequently because of variations at the time of manufacturing the cellular phone 1, the resonance frequency of the non-contact IC portion 147 is out of the desired effective resonance frequency band.

In the past, when the resonance frequency of the non-contact IC portion 147 was out of the desired effective resonance frequency hand, the non-contact IC portion 147 has adjusted with use of solder or the like in order to set the resonance frequency of the non-contact IC portion 147 within the desired effective resonance frequency band. On the contrary, in the embodiment of the invention, even if the resonance frequency of the non-contact IC portion 47 were out of the effective resonance frequency band because of variations at the time of manufacturing the cellular phone 1, capacitance of the antenna parallel capacitor portion can be changed to adjust the resonance frequency of the non-contact IC portion 47 properly after manufacturing the cellular phone 1. As for a method of changing the resonance frequency of the non-contact IC portion 47, ON/OFF of connection of each of the parallel capacitors C1 to C3 is mechanically switched to change the total capacitance of the antenna parallel capacitor portion. On this occasion, switches are used as circuits for switching ON/OFF of connection of the parallel capacitors C1 to C3.

Figure 6:
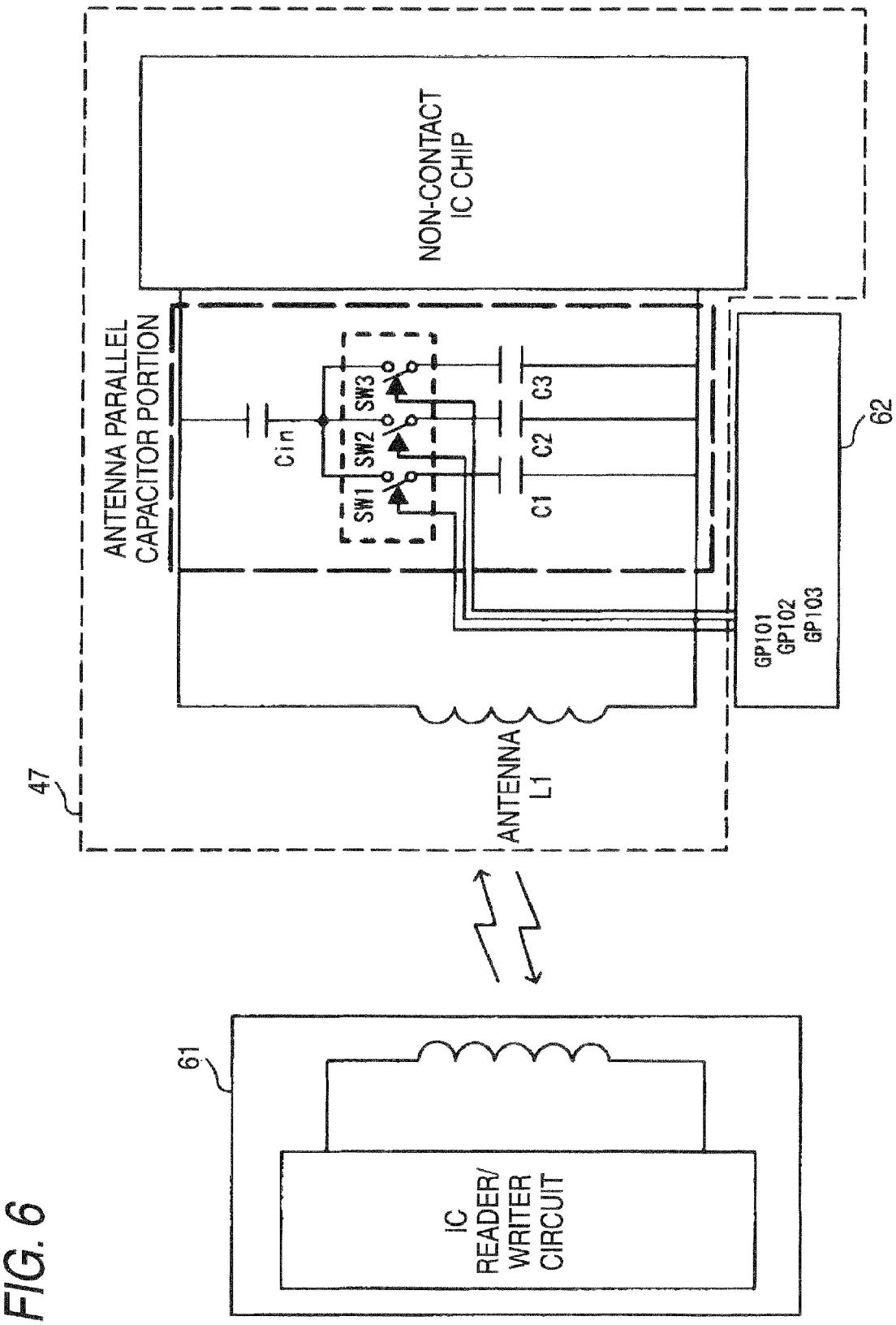
FIG. 6 is a view showing an internal configuration of a non-contact IC portion according to the present invention.

FIG. 6 shows an internal configuration of the non-contact IC portion 47 according to the present invention. As shown in FIG. 6, the non-contact IC portion 47 according to the invention has a non-contact IC chip, an antenna parallel capacitor portion having a capacitor Cin, parallel capacitors C1 to C3, and SW1 to SW3, and an antenna L1. The capacitance values of the capacitor Cin and the parallel capacitors C1 to C3 are fixed values. The SW1 to SW3 are circuits for switching ON/OFF of connection of the parallel capacitors C1 to C3. After the non-contact IC portion 47 is incorporated in the cellular phone 1, a controller IC 62 equipped with a nonvolatile memory can be connected to the non-contact IC portion 47. After connected to the non-contact IC portion 47, the controller IC 62 controls the SW1 to SW3 of the non-contact IC portion 47 to switch ON/OFF of the SW1 to SW3.

Eight combinations are thought of as combinations of switching ON/OFF of connection of the parallel capacitors C1 to C3. Specifically, combinations of C1/C2/C3=OFF/OFF/OFF, C1/C2/C3=ON/OFF/OFF, C1/C2/C3=OFF/ON/OFF, C1/C2/C3=OFF/OFF/ON, C1/C2/C3=ON/ON/OFF, C1/C2/C3=ON/OFF/ON, C1/C2/C3=OFF/ON/ON, and C1/C2/C3=ON/ON/ON are thought of. Accordingly, when the controller IC 62 is used for switching ON/OFF of the SW1 to SW3 after the non-contact IC portion 47 is incorporated in the cellular phone 1, the total capacitance of the antenna parallel capacitor portion can be changed to one of eight combinations.

When, for example, the SW1 to SW3 are turned to satisfy C1/C2/C3=ON/OFF/OFF, the resonance frequency $f_0$ of the non-contact IC portion 47 is changed to $1/\{2\pi\sqrt{L1\times(Cin\times C1)/(Cin+C1)}\}$. When, for example, the SW1 to SW3 are turned to satisfy C1/C2/C3=OFF/ON/OFF, the resonance frequency $f_0$ of the non-contact IC portion 47 is changed to $1/\{2\pi\sqrt{L1\times(Cin\times C2)/(Cin+C2)}\}$. When, for example, the SW1 to SW3 are turned to satisfy C1/C2/C3=ON/OFF/ON, the resonance frequency $f_0$ of the non-contact IC portion 47 is changed to $1/\{2\pi\sqrt{L1\times(Cin\times C1+Cin\times C3)/(Cin+C1+C3)}\}$.

Incidentally, setting values of the SW1 to SW3 need be stored even during powering-off of the cellular phone 1 to prevent the settings of the SW1 to SW3 from being changed again after the settings are changed once. Therefore, the SW1 to SW3 are controlled by the controller IC 62 equipped with a nonvolatile memory.

Figure 7:
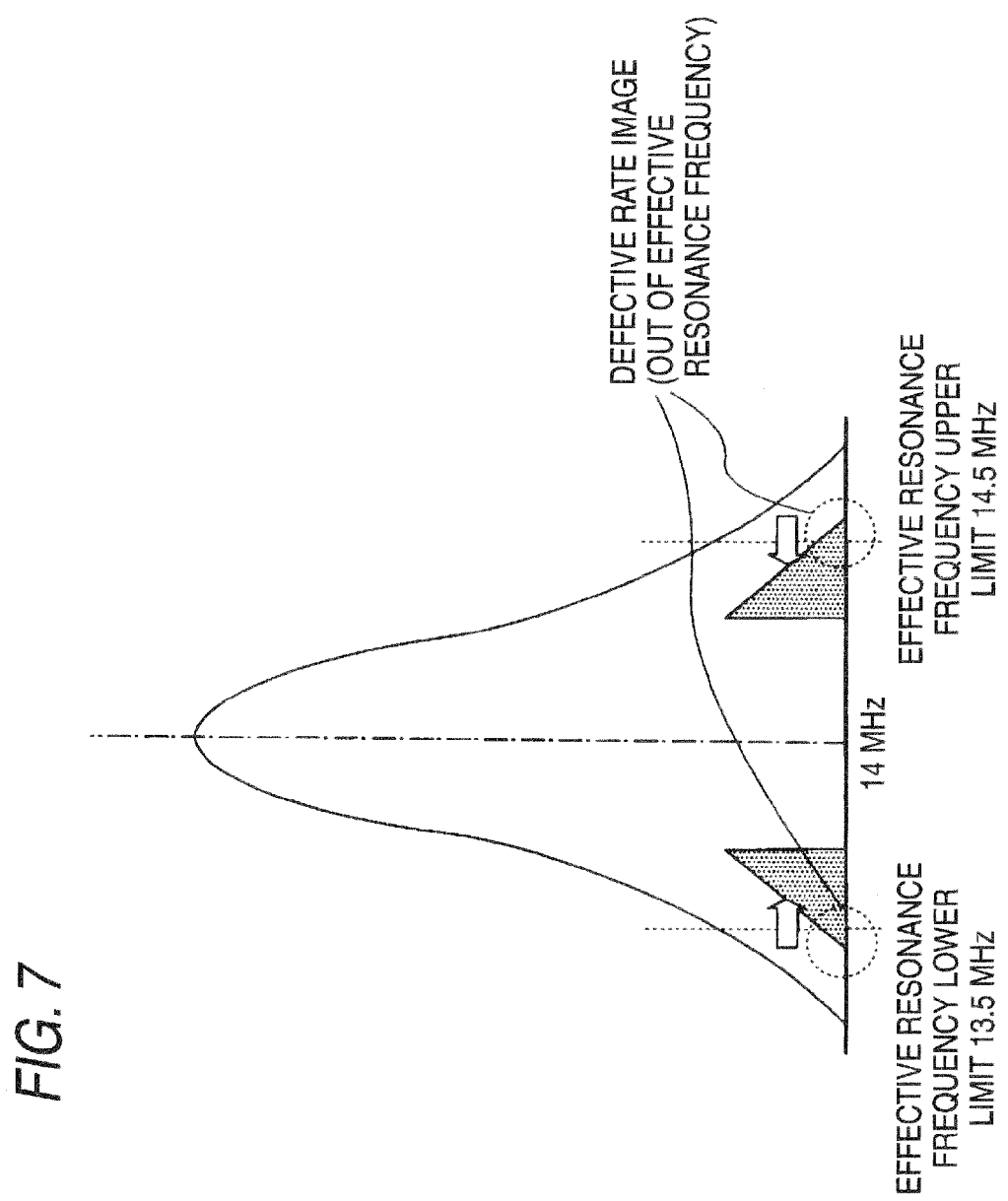
FIG. 7 is a graph showing a state in which a controller IC is used for changing ON/OFF of SW1 to SW3 to restore the resonance frequency of the non-contact IC portion to a desired effective resonance frequency band when the resonance frequency of the non-contact 1C portion is out of the desired effective resonance frequency band because of variations at the time of manufacturing the cellular phone.

FIG. 7 shows a state where the controller IC 62 is used for switching ON/OFF of the SW1 to SW3 to restore the resonance frequency of the non-contact IC portion 47 to a desired effective resonance frequency band when the resonance frequency of the non-contact IC portion 47 is out of the desired effective resonance frequency band because of variations at the time of manufacturing the cellular phone 1. When the resonance frequency of the non-contact IC portion 47 becomes, for example, 13.2 MHz, 14.8 MHz, or the like, consequently because of variations at the time of manufacturing the cellular phone 1, the resonance frequency of the non-contact IC portion 47 is out of the desired effective resonance frequency band. Assuming that the resonance frequency of the non-contact IC portion 47 becomes, for example, 13.2 MHz because of variations at the time of manufacturing the cellular phone 1, then the total capacitance of the antenna parallel capacitor portion is reduced to increase the resonance frequency $f_0$ of the non-contact IC portion 47 in order to restore the resonance frequency of the non-contact IC portion 47 to the desired effective resonance frequency band as shown in FIG. 7. On the other hand, assuming that the resonance frequency of the non-contact IC portion 47 becomes, for example, 14.8 MHz because of variations at the time of manufacturing the cellular phone 1, then the total capacitance of the antenna parallel capacitor portion is increased to lower the resonance frequency $f_0$ of the non-contact IC portion 47 in order to restore the resonance frequency of the non-contact IC portion 47 to the desired effective resonance frequency band as shown in FIG. 7.

More specifically, assuming that the capacitance values of the parallel capacitors C1 to C3 are "1", "4" and "10" respectively, then the total capacitance of the antenna parallel capacitor portion can take any value of (Cin×1)/(Cin+1), (Cin×4)/(Cin+4), (Cin×5)/(Cin+5), (Cin×10)/(Cin+10), (Cin×11)/(Cin+11), (Cin×14)/(Cin+14) and (Cin×15)/(Cin+15). Assuming that the resonance frequency of the non-contact IC portion 47 becomes, for example, 13.2 MHz because of variations at the time of manufacturing the cellular phone 1 in the condition that the SW1 to SW3 are set, for example, to satisfy C1/C2/C3=OFF/OFF/ON (i.e. the total capacitance of the antenna parallel capacitor portion is (Cin×10)/(Cin+10)), then the total capacitance of the antenna parallel capacitor portion is changed from (Cin×10)/(Cin+10), for example, to (Cin×5)/Cin+5) etc. in order to increase the resonance frequency $f_0$ of the non-contact IC portion 47.

On the other hand, assuming that the resonance frequency of the non-contact IC portion 47 becomes, for example, 14.8 MHz because of variations at the time of manufacturing the cellular phone 1 in the condition that the SW1 to SW3 are set, for example, to satisfy C1/C2/C3=OFF/OFF/ON (i.e. the total capacitance of the antenna parallel capacitor portion is (Cin×10)/(Cin+10)), then the total capacitance of the antenna parallel capacitor portion is changed from (Cin×10)/(Cin+10), for example, to (Cin×14)/Cin+14) etc. in order to reduce the resonance frequency $f_0$ of the non-contact IC portion 47.

In the embodiment of the present invention, in the cellular phone 1 having the non-contact IC portion 47 which performs radio communication with the reader/writer, the non-contact IC portion 47 has capacitors (antenna parallel capacitor portion) connected so that capacitance can be changed between multiple stages, an antenna coil L1 connected to the capacitors, and a switching portion (SW1 to SW3) for turning on/off connection of the capacitors so that a resonance frequency expressed based on capacitance of the capacitors and inductance of the coil is set within a given effective resonance frequency range.

Accordingly, when the resonance frequency of the non-contact IC portion 47 is out of a desired effective resonance frequency band because of variations at the time of manufacturing the cellular phone 1, the controller IC 62 can be used for changing ON/OFF of the SW1 to SW3 to thereby restore the resonance frequency of the non-contact IC portion 47 to the desired effective resonance frequency band and widen the apparent band width of the effective resonance frequency. Accordingly, a defective rate of the cellular phone 1 can be reduced so that the yield at the time of manufacturing the cellular phone 1 can be improved greatly.

Figure 8A:
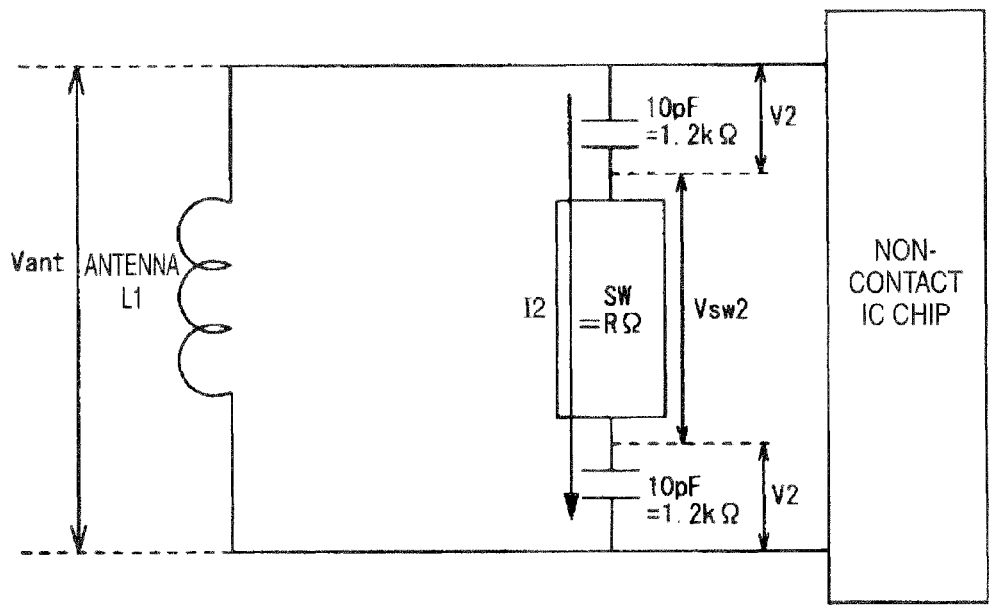
Figure 8B:
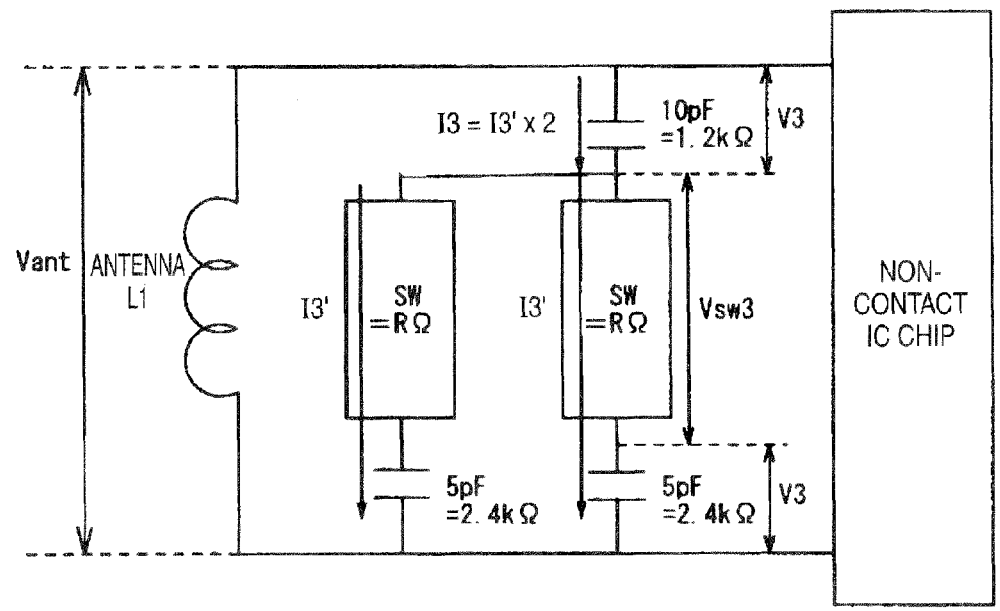

However, when only one SW is set to be ON, loss in antenna waveform occurs because of resistance of the SW to worsen waveform characteristic slightly. FIGS. 8A and 8B show influence on waveform characteristic based on difference in configuration of SW set to be ON. FIG. 8A shows a configuration in which the number of SW set to be ON is one. FIG. 8B shows a configuration in which the number of SW set to be ON is two. When the number of SW set to be ON is one as shown in FIG. 8A, the voltage applied on the antenna L1 is Vant=(2.4 kΩ+R)×I2. On the other hand, when the number of SW set to be ON is two as shown in FIG. 8B, the voltage applied on the antenna L1 is Vant'=1.2 kΩ×I3'×2+(R+2.4 kΩ)×I3'=(4.8 kΩ+R)×I3'.

Because the voltage Vant in FIG. 8A and the voltage Vant' in FIG. 8B are equal to each other, (2.4 kΩ+R)×I2=(4.8 kΩ+R)×I3' holds. From this fact, I2=(4.8 kΩ+R)×I3'/(2.4 kΩ+R) is obtained. Accordingly, I2>I3' is obtained, so that the relation between VSW2 in FIG. 8A and VSW3 in FIG. 8B is VSW2(=R×I2)>VSW3(=R×I3').

Figure 9A:
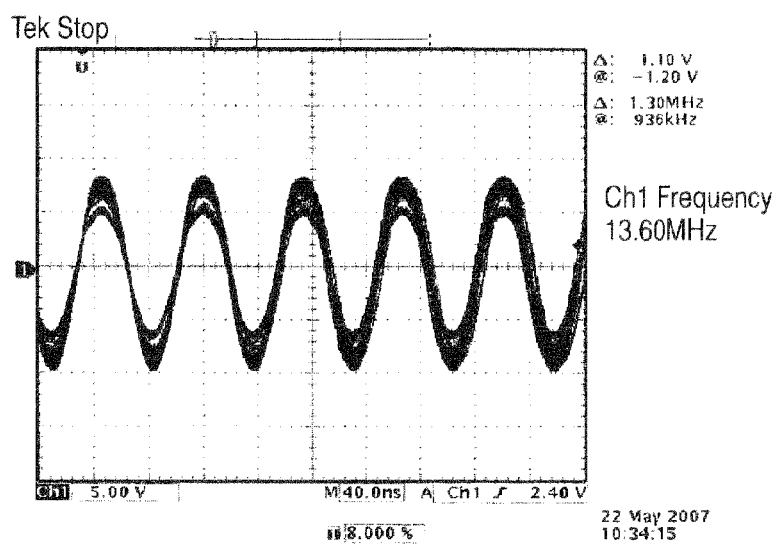
Figure 9B:
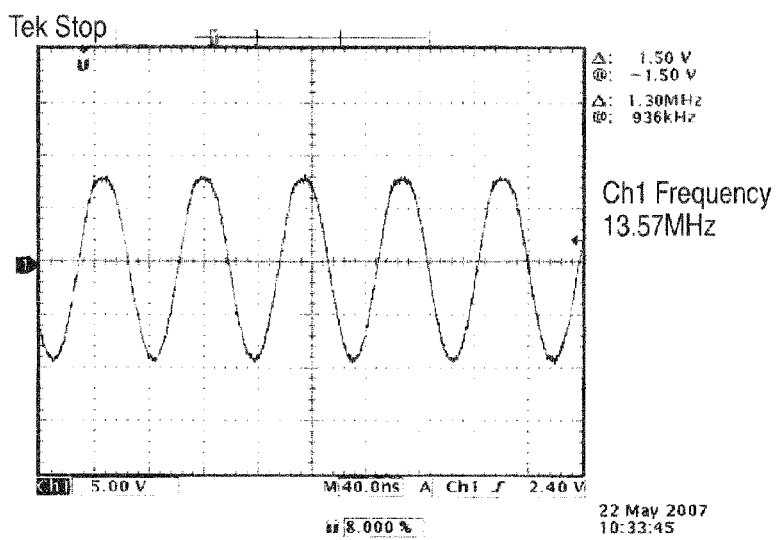
Figure 9C:
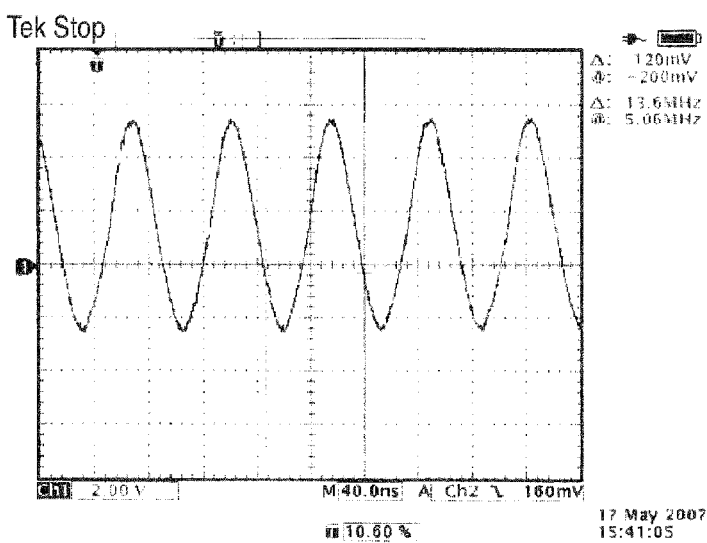

FIGS. 9A to 9C show distortion of waveform characteristic based on difference in configuration of SW set to be ON. FIG. 9A shows distortion of waveform characteristic in a configuration in which the number of SW set to be ON is one. FIG. 9B shows distortion of waveform characteristic in a configuration in which the number of SW set to be ON is two. FIG. 9C shows distortion of waveform characteristic in a configuration in which there is no SW set to be ON. Waveform characteristic shown in FIG. 9A and waveform characteristic shown in FIG. 9C are compared with each other as follows. In the case of waveform characteristic shown in FIG. 9A, the number of SW set to be ON is one, so that the amplitude of the voltage is reduced by a certain amount in accordance with loss corresponding to resistance of SW and the amplitude of the voltage is further reduced at a predetermined period in accordance with influence of reflection. Moreover, because peaks of the amplitude increase and decrease at a predetermined period, a collapsed waveform is obtained when the waveform is displayed continuously. On the contrary, in the case of waveform characteristic shown in FIG. 9B, the number of SW set to be ON is two, so that the amplitude of the voltage is reduced by a certain amount in accordance with loss corresponding to resistance of SW and a topmost of each peak of the amplitude is rounded slightly compared with the waveform shown in FIG. 9C. However, in the case of waveform characteristic shown in FIG. 9B, distortion of waveform characteristic can be reduced because loss corresponding to resistance of SW is low even when the total capacitance of the antenna parallel capacitor portion viewed from the antenna L1 side is equal compared with the waveform characteristic shown in FIG. 9A. Accordingly, when the configuration in which the number of SW set to be ON is two is used, it is possible to obtain the same waveform characteristic as the waveform characteristic in the conventional antenna parallel capacitor portion composed of only the parallel capacitors without use of any SW.

Incidentally, the present invention can be applied not only to the cellular phone 1 but also to a personal digital assistant (PDA), a personal computer, a portable game machine, a portable music player, a portable video player, or another information processing apparatus.

The series of processes described in the embodiment of the present invention may be executed by software or may be executed by hardware.

Although the embodiment of the present invention has been described in the case where steps of a flow chart are processed in a time sequence along the described order, the steps include steps which are not always processed in a time sequence but processed in parallel or individually.

What is claimed is:
1. An information processing apparatus comprising:
a non-contact IC which performs radio communication with a reader/writer,
wherein the non-contact IC includes:
capacitors connected so that capacitance is capable to change in multiple stages;
a coil connected to the capacitors; and
a switching portion which turns on/off connection of the capacitors so that a resonance frequency expressed based on capacitance of the capacitors and inductance of the coil is set within a given effective resonance frequency range,
wherein the capacitors includes:
a first capacitor; and
at least one second capacitor connected to the first capacitor through the switching portion the first capacitor and the second capacitor being connected in series
wherein the switching portion turns on/off connection of the second capacitor to the first capacitor so that the resonance frequency is set within the given effective resonance frequency range.
2. The information processing apparatus according to claim 1,
wherein at least two second capacitors are provided as the second capacitors, and wherein connection of the second capacitors to the first capacitor is changed from OFF to ON so that the resonance frequency is set within the given effective resonance frequency range.

3. The information processing apparatus according to claim 2, wherein at least two second capacitors are connected in parallel with each other.

4. The information processing apparatus according to claim 1, wherein the switching portion turns on/off connection of the capacitors so that the resonance frequency is set within an effective resonance frequency range defined based on a lower limit effective resonance frequency and an upper limit effective resonance frequency.

5. The information processing apparatus according to claim 4, wherein the switching portion turns on/off connection of the capacitors to increase capacitance of the capacitors when the resonance frequency is lower than the lower limit effective resonance frequency.

6. The information processing apparatus according to claim 4, wherein the switching portion turns on/off connection of the capacitors to reduce capacitance of the capacitors when the resonance frequency is higher than the upper limit effective resonance frequency.

7. The information processing apparatus according to claim 1, wherein the switching portion turns on/off connection of the capacitors so that the resonance frequency is set within the given effective resonance frequency range in accordance with an instruction signal given from an external controller connected to the information processing apparatus.

8. A method of manufacturing an information processing apparatus comprising:
   providing a non-contact IC which performs radio communication with a reader/writer and including capacitors connected so that capacitance is capable to be changed between multiple stages, and a coil connected to the capacitors; and
   switching on/off connection of the capacitors using a switching portion so that a resonance frequency expressed based on capacitance of the capacitors and inductance of the coil is set within a given effective resonance frequency range,
   wherein the capacitors include:
   a first capacitor; and
   at least one second capacitor connected to the first capacitor through the switching portion the first capacitor and the second capacitor being connected in series,
   wherein the switching portion turns on/off connection of the second capacitor to the first capacitor so that the resonance frequency is set within the given effective resonance frequency range.

* * * * *